United States Patent
Cyran et al.

(10) Patent No.: US 6,803,773 B1
(45) Date of Patent: Oct. 12, 2004

(54) METHOD AND CIRCUIT FOR DETECTING A CHANGE IN INDUCTANCE

(75) Inventors: Curtis P. Cyran, Dayton, OH (US); Robert J. Disser, Dayton, OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/615,570

(22) Filed: Jul. 8, 2003

(51) Int. Cl.[7] .............................................. G01R 27/28
(52) U.S. Cl. ..................... 324/656; 324/654; 324/76.75
(58) Field of Search ................................. 324/654–656, 324/76.75, 207.15; 246/63 R, 194

(56) References Cited

U.S. PATENT DOCUMENTS

| | | | |
|---|---|---|---|
| 3,683,176 A | * 8/1972 | Crofts et al. | 246/40 |
| 4,777,436 A | 10/1988 | Fiori, Jr. | 324/207.17 |
| 5,027,691 A | 7/1991 | Kennedy | 84/727 |
| 5,041,791 A | 8/1991 | Ackerman et al. | 324/318 |
| 5,336,997 A | 8/1994 | Anim-Appiah et al. | 324/207.16 |
| 5,501,417 A | 3/1996 | Capan | 246/63 R |
| 5,608,318 A | 3/1997 | Yasui | 324/233 |
| 5,628,478 A | 5/1997 | McConnel et al. | 246/194 |
| 6,101,879 A | 8/2000 | Shirai et al. | 73/514.39 |
| 6,208,132 B1 | 3/2001 | Kliman et al. | 324/177 |
| 2002/0179250 A1 | 12/2002 | Veltrop et al. | 156/345.48 |

* cited by examiner

Primary Examiner—Vincent Q. Nguyen
(74) Attorney, Agent, or Firm—Michael D. Smith

(57) ABSTRACT

A method and circuit for detecting a change in inductance of a variable inductance element. An oscillating signal has a frequency that varies with inductance of the element. An intermediate voltage is produced at a level that varies according to frequency of the oscillating signal. The intermediate voltage is scaled to produce an output voltage.

20 Claims, 3 Drawing Sheets

US 6,803,773 B1

METHOD AND CIRCUIT FOR DETECTING A CHANGE IN INDUCTANCE

TECHNICAL FIELD

The present invention relates generally to inductive sensors, and more particularly to a method for detecting a change in the inductance of an inductive sensor.

BACKGROUND OF THE INVENTION

Conventional inductive sensors may use an inductive coil positioned relative to a magnetostrictive object such that magnetic flux lines induced by an alternating electric current in the coil pass through the object in a direction substantially parallel to the strain direction. The inductance of the coil is measured over time. A change in permeability of the object due to a change in strain of the object is detected or determined from a change in the measured inductance over time.

What is needed is an improved method for accurately detecting a change in the inductance of such inductive sensors as well as other variable inductance elements.

SUMMARY OF THE INVENTION

In a first aspect, a method for detecting changes in inductance of a variable inductance element involves the steps of: a) producing an oscillating signal having a frequency that varies in proportion to variations in inductance of the variable inductance element; b) producing an intermediate analog voltage that varies in proportion to variations in frequency of the oscillating signal of step a); c) scaling the intermediate analog voltage of step b) to produce an output analog voltage; and d) detecting changes in inductance of the variable inductance element based upon changes in the output analog voltage of step c).

In another aspect, a method is provided to convert a known range of inductance change of a variable inductance element between a first inductance and a second inductance into a desired range of analog voltage change between a first voltage level and a second voltage level. The method involves the steps of: a) establishing an oscillator circuit incorporating the variable inductance element so as to produce an oscillating signal having a frequency that varies with inductance of the variable inductance element, the oscillating signal produced with a first frequency when the variable inductance element has the first inductance and produced with a second frequency when the variable inductance element has the second inductance; b) establishing a circuit to convert the frequency of the oscillating signal to an intermediate analog voltage, the intermediate analog voltage produced at a first intermediate level when the oscillating signal has the first frequency and produced at a second intermediate level when the oscillating signal has the second frequency; and c) establishing a circuit to scale the intermediate analog voltage so as to produce an output voltage within the desired range, the output voltage produced at the first voltage level when the intermediate analog voltage is at the first intermediate level and produced at the second voltage level when the intermediate analog voltage is at the second intermediate level.

In a further aspect, a circuit for producing a voltage level substantially proportional to inductance of a variable inductance element includes an oscillator stage having the variable inductance element connected therein and producing an oscillating signal having a frequency that varies with inductance of the variable inductance element. A conversion stage is operatively connected to receive the oscillating signal and produces an intermediate analog voltage that varies in proportion to variations in the frequency of the oscillating signal. An amplification stage is operatively connected to receive the intermediate analog voltage and operates to offset and amplify the analog voltage to produce an output analog voltage with a voltage level proportional to inductance of the variable inductance element.

The foregoing methods and circuit provide a practical, effective and relatively inexpensive way to detect changes in inductance of a variable inductive element.

DESCRIPTION OF THE PREFERRED EMBODIMENT

Figure 1:
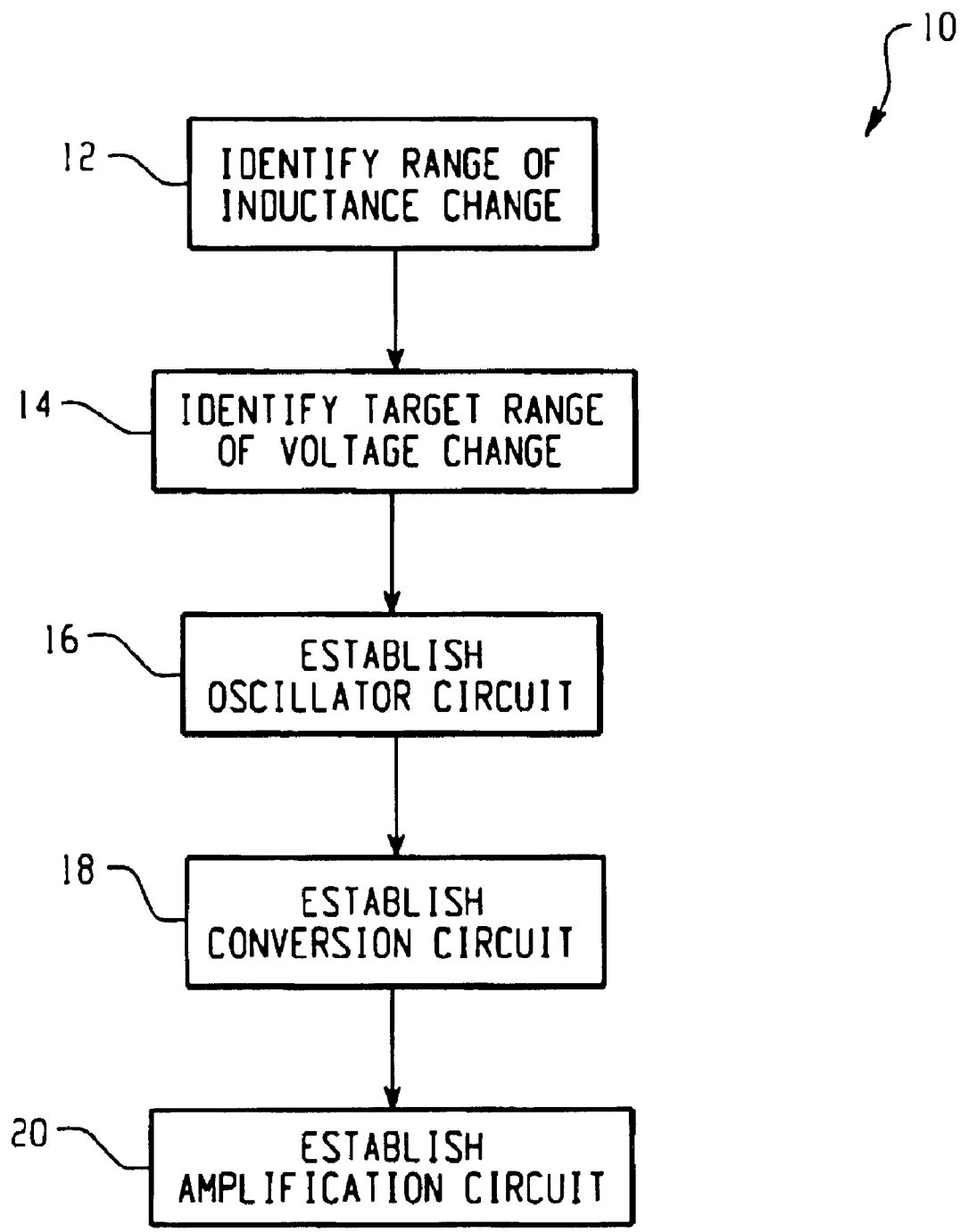
FIG. 1 is a flow chart of one method.
Figure 2:
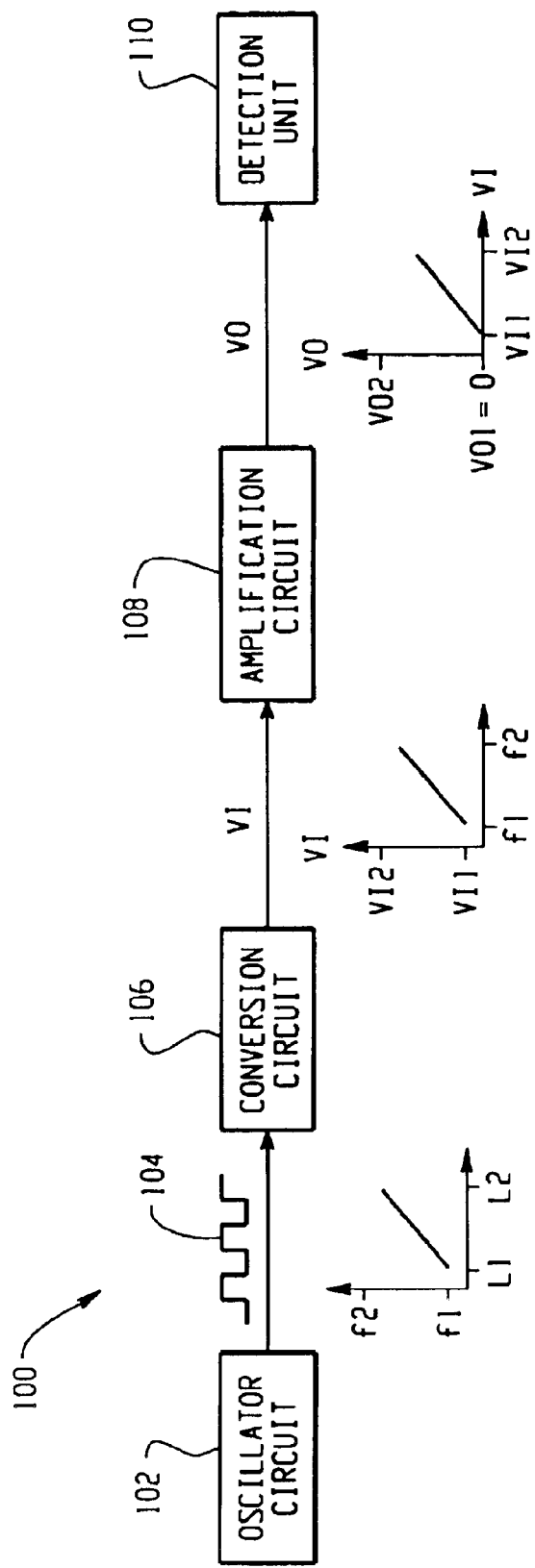
FIG. 2 is a schematic of one circuit in accordance with the method.

A flow chart 10 illustrating one embodiment of a method is shown in FIG. 1 and a corresponding circuit 100 is shown in FIG. 2. First, assume the case of any variable inductance element. In one example the element is an inductive sensor, which in one form is a coil located adjacent a magnetostrictive object. However, other variable inductance elements are contemplated. A range of change in inductance of the variable inductance element, such as between a first inductance L1 and a second inductance L2, is known or otherwise identified at step 12. For example, in many inductive sensor applications the anticipated range of change in inductance of the inductive sensor will be known. A target range of corresponding voltage change, such as between a first voltage level VO1 and a second voltage level VO2, is known or otherwise identified in step 14. For example, in a digital system a standard range of identifiable voltage change might be between VO1=0 volts and VO2=5 volts. In another example the target voltage range might be VO1=0.5 volts to VO2=4.5 volts.

At step 16 an oscillator circuit 102 (FIG. 2) is established and the variable inductance element incorporated therein such that the oscillator circuit produces an oscillating signal having a frequency that varies with inductance of the variable inductance element. The oscillating signal 104 is produced with a first frequency f1 when the variable inductance element has the first inductance L1 and is produced with a second frequency when the variable inductance element has the second inductance L2. At step 18 a circuit 106 is established to convert the frequency of the oscillating signal 104 to an intermediate analog voltage VI. The intermediate analog voltage VI is produced at a first intermediate level VI1, which in one example is a non-zero level, when the oscillating signal 104 has the first frequency f1 and is produced at a second intermediate level VI2, which may also be a non-zero level, when the oscillating signal 104 has the second frequency f2. At step 20 an amplification circuit 108 is established to offset and amplify the intermediate analog voltage VI so as to produce an output voltage VO at the first voltage level VO1 when the intermediate analog voltage VI is at the first intermediate level VI1 and to produce an output voltage VO at the second voltage level VO2 when the intermediate analog voltage VI is at the second intermediate level VI2. A detection unit 110, such a processor, can then be used to examine the voltage of the output signal VO to identify and track changes in inductance of the variable inductance element.

Accordingly, the basic method of detecting changes in inductance of a variable inductance element involves producing an oscillating signal 104 having a frequency that varies in proportion to variations in inductance of the variable inductance element; producing an intermediate analog voltage VI that varies in proportion to variations in frequency of the oscillating signal 104; scaling the intermediate analog voltage VI to produce an output analog voltage VO; and detecting changes in inductance of the variable inductance element based upon changes in the output analog voltage VO. In one implementation the scaling step involves both amplifying and offsetting the intermediate analog voltage.

Figure 3:
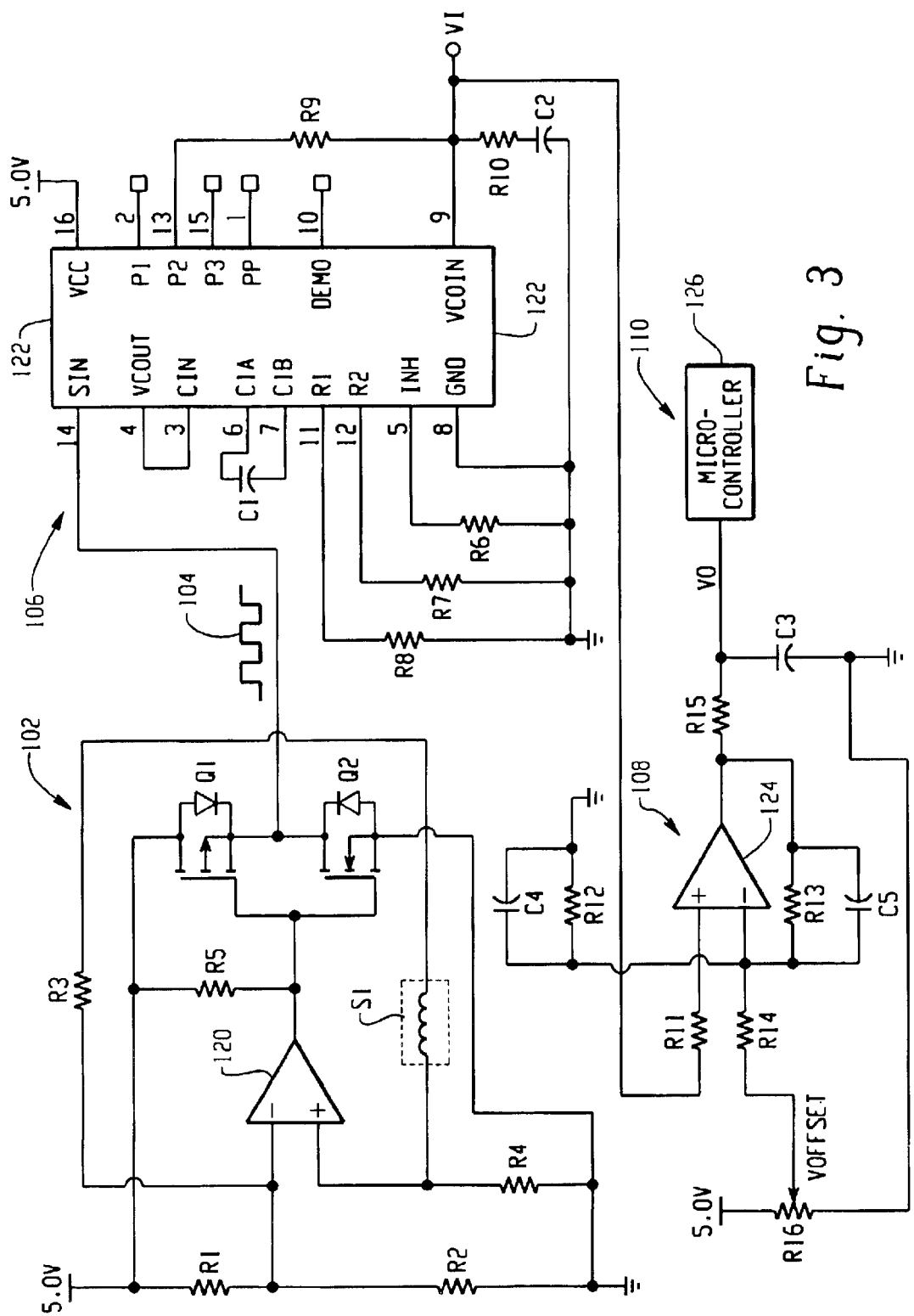
FIG. 3 is a detailed schematic of one implementation of the circuit of FIG 2.

Referring now to FIG. 3, a more detailed schematic of one embodiment of the circuit of FIG. 2 is provided. The illustrated oscillator circuit or stage 102 is set up around comparator 120 and is formed as an RL oscillator with a variable inductance element, in the form of inductive sensor S1, connected in the feedback stage or path of the oscillator. Resistor R3 is also connected in the feedback stage. The oscillator output frequency is proportional to the time constant produced by the feedback stage. As the inductance of sensor S1 varies, the time constant changes and therefore the frequency of oscillating signal 104 varies. The circuit component values are selected to produce oscillating signal 104 varying between frequencies f1 and f2 when the inductance of sensor S1 varies between inductances L1 and L2. Resistors R4 and R5 are also provided in the oscillator circuit. Transistors Q1 and Q2 are provided in the output path of the oscillator to provide increased current capacity in the output oscillating signal 104. The illustrated conversion circuit or stage 106 is set up as a phase-locked loop (PLL) circuit using a PLL integrated circuit (IC) 122 (such as the 74HC4046A). Resistor R6 is connected between an inhibit input of the IC 122 and ground to maintain that input low. Resistors R7 and R8, in combination with capacitor C1, are selected to set the frequency range of a voltage controlled oscillator (VCO) within IC 122. The intermediate voltage VI is produced by providing the output of a phase comparator internal of IC 122 to an RC filter combination provided by resistor R9 and resistor R10 and capacitor C2. Preferably the output voltage VI is produced between voltage level VI1 and VI2 that falls within a linear operating range of the PLL circuit. For example, VI1 may be around 2 volts and VI2 may be around 4 volts. The illustrated amplification circuit or stage 108 utilizes an operational amplifier 124 (such as the MC33202), with VI forming one input of the op-amp through resistor R11 and with an offset voltage level VOFFSET forming the other input to the op-amp through resistor R14. The offset voltage is setup by a potentiometer using resistor R16. Resistor and capacitor pairs R12, C4 and R13, C5 are provided for proper op-amp stability and operation. An RC filter formed by resistor R15 and capacitor C3 is provided at the output side of the op-amp to provide increased stability of the voltage output VO. The illustrated detection unit 110 is provided by a micro-controller 126, with the signal VO being applied to an A/D input of the microcontroller to facilitate digital processing and analysis of the output signal VO.

Figure 4:
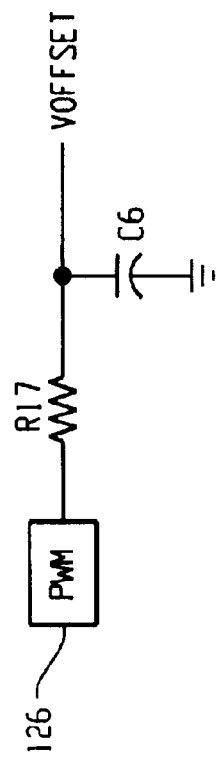
FIG. 4 is a schematic of one alternative for producing an offset voltage.

Referring to FIG. 4, in place of the potentiometer set up on resistor R16, an alternative embodiment of amplification circuit or stage 108 could utilize a PWM output channel of the microcontroller 126 to set the offset voltage VOFFSET through the RC filter created by resistor R17 and capacitor C6. In such a case the microcontroller 126 could be programmed to automatically set the offset voltage.

The foregoing description has been presented for purposes of illustration. It is not intended to be exhaustive or to limit the invention to the precise forms or procedures disclosed, and obviously many modifications and variations are possible in light of the above teaching. For example, while specific embodiments of oscillator circuit or stage 102, conversion circuit or stage 106, amplification or scaling circuit or stage 108 and detection unit 110 are shown and described with reference to FIG. 3, it is recognized that in each case other circuit configurations could be used. It is intended that the scope of the invention be defined by the claims appended hereto.

What is claimed is:

1. A method for detecting changes in inductance of a variable inductance element comprising the steps of:
    a) producing an oscillating signal having a frequency that varies in proportion to variations in inductance of the variable inductance element;
    b) producing an intermediate analog voltage that varies in proportion to variations in frequency of the oscillating signal of step a);
    c) scaling the intermediate analog voltage of step b) to produce an output analog voltage; and
    d) detecting changes in inductance of the variable inductance element based upon changes in the output analog voltage of step c).

2. The method of claim 1, wherein the variable inductance element comprises an inductive sensor.

3. The method of claim 2 where the inductive sensor includes at least one coil located adjacent a magnetostrictive object.

4. The method of claim 1, wherein in step a) the oscillating signal is a square wave signal.

5. The method of claim 1, wherein step d) includes inputting the output analog voltage to an analog to digital converter.

6. The method of claim 1, wherein step b) involves inputting the oscillating signal to a phase-locked loop circuit.

7. The method of claim 1, wherein step a) involves connecting the variable inductance element in a feedback path of an oscillator circuit.

8. The method of claim 1 wherein the scaling of step c) involves offsetting and amplifying the intermediate analog voltage.

9. A method of converting a known range of inductance change of a variable inductance element between a first inductance and a second inductance into a desired range of analog voltage change between a first voltage level and a second voltage level, comprising the steps of:
    a) establishing an oscillator circuit incorporating the variable inductance element so as to produce an oscillating signal having a frequency that varies with inductance of the variable inductance element, the oscillating signal produced with a first frequency when the variable inductance element has the first inductance and produced with a second frequency when the variable inductance element has the second inductance;
    b) establishing a circuit to convert the frequency of the oscillating signal to an intermediate analog voltage, the intermediate analog voltage produced at a first intermediate level when the oscillating signal has the first frequency and produced at a second intermediate level when the oscillating signal has the second frequency; and c) establishing a circuit to scale the intermediate analog voltage so as to produce an output voltage within the desired range, the output voltage produced at the first voltage level when the intermediate analog voltage is at the first intermediate level and produced at the second voltage level when the intermediate analog voltage is at the second intermediate level.

10. The method of claim 9 wherein the circuit established in step b) is configured such that the first intermediate level is a non-zero level and the second intermediate level is a non-zero level.

11. The method of claim 10, wherein in step b) the established circuit is a phase-locked loop circuit.

12. The method of claim 11, wherein in step b) a range defined between the first intermediate level and the second intermediate level is a substantially linear output range of the phase-locked loop circuit.

13. The method of claim 9, wherein the variable inductance element is connected in a feedback path of the oscillator circuit.

14. The method of claim 9, wherein the first voltage level is about 0 volts and the second voltage level is about 5 volts.

15. A circuit for producing a voltage level substantially proportional to inductance of a variable inductance element, the circuit comprising:

an oscillator stage having the variable inductance element connected therein and producing an oscillating signal having a frequency that varies with inductance of the variable inductance element;

a conversion stage operatively connected to receive the oscillating signal and producing an intermediate analog voltage that varies in proportion to variations in the frequency of the oscillating signal; and an amplification stage operatively connected to receive the intermediate analog voltage and operating to offset and amplify the intermediate analog voltage to produce an output analog voltage with a voltage level proportional to inductance of the variable inductance element.

16. The circuit of claim 15 wherein the conversion stage comprises a phase-locked loop circuit.

17. The circuit of claim 15 wherein the variable inductance element is connected in a feedback path of the oscillator stage.

18. The circuit of claim 15 wherein the amplification stage includes an adjustable offset control component.

19. The circuit of claim 18 wherein the adjustable offset control component comprises a potentiometer.

20. The circuit of claim 18 wherein the adjustable offset control component comprises an automated control component.

* * * * *